United States Patent
Doh

(10) Patent No.: US 8,848,334 B2
(45) Date of Patent: Sep. 30, 2014

(54) ELECTROSTATIC CHUCK

(75) Inventor: Sung-Won Doh, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 389 days.

(21) Appl. No.: 13/251,096

(22) Filed: Sep. 30, 2011

(65) Prior Publication Data

US 2012/0320491 A1 Dec. 20, 2012

(30) Foreign Application Priority Data

Jun. 14, 2011 (KR) .................. 10-2011-0057210

(51) Int. Cl.
*H01L 21/683* (2006.01)
*H01T 23/00* (2006.01)
*H01L 21/687* (2006.01)

(52) U.S. Cl.
CPC ........ *H01L 21/6875* (2013.01); *H01L 21/6833* (2013.01)
USPC .......................................... 361/234; 361/230

(58) Field of Classification Search
CPC ........... H01T 23/00; H01T 19/00; H05F 3/04; G03G 15/02; F24F 3/166; H01L 41/45; H01L 21/6833; H01L 21/6831; H01G 7/023; H01G 7/02; H02N 13/00
See application file for complete search history.

(56) References Cited

U.S. PATENT DOCUMENTS

2009/0161285 A1* 6/2009 Abouaf et al. ................ 361/234
2010/0046134 A1* 2/2010 Mizuno et al. ................ 361/234

FOREIGN PATENT DOCUMENTS

| KR | 10-2006-0074710 (A) | 7/2006 |
| KR | 10-2007-0056561 (A) | 6/2007 |
| KR | 10-2008-0076574 (A) | 8/2008 |
| KR | 10-2010-0029992 (A) | 3/2010 |

* cited by examiner

*Primary Examiner* — Jared Fureman
*Assistant Examiner* — Terrence Willoughby
(74) *Attorney, Agent, or Firm* — Knobbe Martens Olson & Bear, LLP

(57) ABSTRACT

An electrostatic chuck for manufacturing a flat panel display is disclosed. In one embodiment, the electrostatic chuck includes i) a base substrate, ii) an insulating layer formed on the base substrate and iii) a conductive layer formed on the insulating layer and electrically connected to a power device. The electrostatic chuck further includes a dielectric layer formed on the conductive layer and including an emboss part and a trench part surrounding the emboss part. The emboss part comprises a plurality of contact parts and at least one protrusion. The trench part includes at least one channel. The contact parts and the protrusion have different shapes. The electrostatic chuck further includes a cooling gas line extending through the base substrate, the insulating layer, the conductive layer, and the dielectric layer.

25 Claims, 8 Drawing Sheets

ELECTROSTATIC CHUCK

CROSS-REFERENCE TO RELATED APPLICATIONS

This application claims priority to and the benefit of Korean Patent Application No. 10-2011-0057210, filed on Jun. 14, 2011, in the Korean Intellectual Property Office, the entire content of which is incorporated herein by reference.

BACKGROUND

1. Field

The described technology generally relates to an electrostatic chuck for manufacturing a flat panel display such as an organic light emitting diode (OLED) display.

2. Description of the Related Technology

An OLED is a self-emitting display device using a phenomenon, in which electrons and holes injected through the positive pole and the negative pole are recombined in an organic layer formed with a monomer, a low molecule, or a polymer to form an exciton, so that light in a particular wavelength is generated by energy from the formed exciton.

The positive pole of the OLED may employ an indium tin oxide (ITO) film having a low sheet resistance and a good permeability, and the organic layer may employ a multilayer structure of a hole injection layer (HIL), a hole transport layer (HTL), an emission layer (EML), an electronic transport layer (En), and an electronic injection layer (EIL) in order to improve the light emitting efficiency. Further, the negative pole may employ a metal film of LiF—Al, etc.

A manufacturing process of the OLED is generally divided into three steps of a pre-process, a post-process, and an encapsulation process. The pre-process, which is a process of forming the ITO thin film on a crystal substrate by using the sputtering, has been already commercially available for manufacturing a liquid crystal display. The encapsulation process is a process of sealing a device for extending the durability of the device because the organic layer is very weak against moisture and oxygen in the air. The post-process is a process of forming an organic layer and a metal layer on a substrate. The post-process mainly employs a vacuum deposition method which evaporates an organic material in a high vacuum atmosphere and forms a pixel patterning by using a shadow mask on a substrate.

In an active drive-type OLED display device among the OLED display devices, the pixels, which are the basic units for an image representation, are arrayed in a matrix form. Further, a thin film transistor (TFT), serving as a switching device, is disposed for each pixel, to independently control the pixel.

SUMMARY

One inventive aspect is an electrostatic chuck for sucking and supporting a substrate by an electrostatic force within a vacuum chamber.

Another aspect is an electrostatic chuck, in which a trench part and an emboss part are formed in an upper part of an electrode for the electrostatic chuck.

Another aspect is an electrode for an electrostatic chuck, which is capable of solving the defects, such as an electrode spot or a lattice spot and a PR burning.

Another aspect is an electrostatic chuck including the aforementioned electrode.

Another aspect is an electrode for an electrostatic chuck and an electrostatic chuck including the electrode, in which a trench part and an emboss part are combined and located in an electrode structure, thereby simultaneously solving an electrode spot or a lattice spot and a PR burning.

Another aspect is an electrostatic chuck, in which both a trench part and an emboss part are formed in a dielectric layer constituting an electrode part.

Another aspect is an electrostatic chuck which includes: a base substrate; an insulating layer formed on the base substrate; a conductive layer formed on the insulating layer; a dielectric layer formed on the conductive layer; and a cooling gas line extending through the base substrate, the insulating layer, the conductive layer, and the dielectric layer.

The conductive layer is connected with a power device. Further, the dielectric layer includes an emboss part and a trench part, the trench part is located at an outside part of the dielectric layer and includes one or more channels, and the emboss part is located at an inside part of the dielectric layer and includes plural protrusions.

In the above electrostatic chuck, the trench part occupies about 2% to about 30% of an entire area of the dielectric layer.

In the above electrostatic chuck, the trench part includes a closed circuit shaped like a rim at the outermost part of the dielectric layer.

In the above electrostatic chuck, the trench part occupies about 1% to about 10% of the entire width of the dielectric layer.

In the above electrostatic chuck, the channel has a width of about 0.1 mm to about 50 mm, a depth of about 0.01 mm to about 1 mm, and a space (or a distance) of about 10 mm to about 1000 mm with a neighboring channel.

In the above electrostatic chuck, the emboss part occupies about 70% to about 98% of the entire area of the dielectric layer.

In the above electrostatic chuck, the protrusion has a height of about 0.01 mm to about 1 mm, a diameter of about 0.1 mm to about 10 mm, and a space (or a distance) of about 1 mm to about 50 mm with a neighboring protrusion.

In the above electrostatic chuck, the cooling gas is helium (He).

In the above electrostatic chuck, the dielectric layer is made of a ceramic material.

In the above electrostatic chuck, the power device supplies DC power.

In the above electrostatic chuck, the electrostatic chuck further includes a dam.

Another aspect is an electrode for an electrostatic chuck including a conductive layer and a dielectric layer.

Another aspect is an electrode for an electrostatic chuck which includes the conductive layer and the dielectric layer formed on the conductive layer. The conductive layer is connected with a power device. Further, the dielectric layer includes an emboss part and a trench part, the trench part is located at an outside part of the dielectric layer and includes one or more channels, and the emboss part is located at an inside part of the dielectric layer and includes plural protrusions.

DETAILED DESCRIPTION

Figure 1:
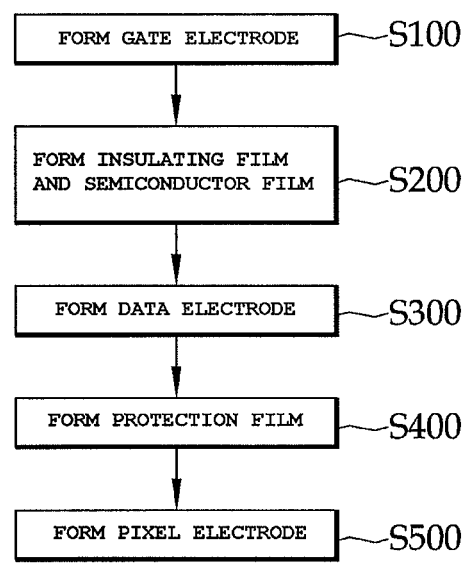
FIG. 1 is a flowchart illustrating a process of manufacturing a thin film transistor.

FIG. 1 is a flowchart illustrating a process of manufacturing a TFT used in an OLED display. Referring to FIG. 1, the process includes i) S100 of forming a gate electrode on a substrate, ii) S200 of forming an insulating film and a semiconductor film in which a semiconductor layer is formed by a patterning and a gate insulating film is formed on an entire surface of the substrate so as to cover the semiconductor layer, iii) S300 of forming a data electrode in which source and drain regions are formed at both edges of the semiconductor layer, iv) S400 of forming a protection film, and v) S500 of forming a pixel electrode in which a source electrode and a drain electrode, etc., are formed.

Figure 2:
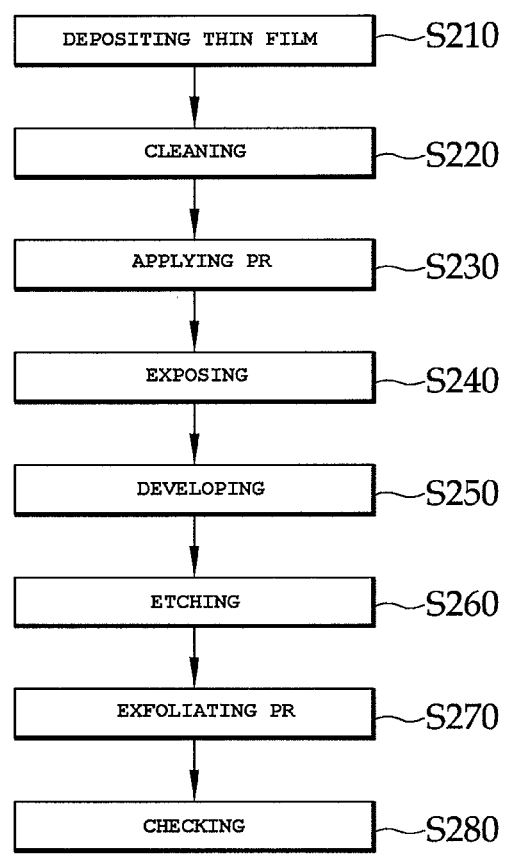
FIG. 2 is a flowchart illustrating a detailed process of forming an insulating film and a semiconductor film.

FIG. 2 is a flowchart illustrating the detailed procedure of S200 shown in FIG. 1. Referring to FIG. 2, S200 includes i) S210 of a thin film deposition in which the thin film is deposited on the substrate, ii) S220 of a cleaning in which foreign materials on the substrate are removed, iii) S230 of a photo resist (PR) application in which the PR is applied and iv) S240 of an exposure in which ultraviolet (UV) radiation is incident through an exposure mask. S200 further includes v) S250 of a development in which the PR dissolved by the UV radiation is removed, vi) S260 of an etching in which the deposited thin film is selectively removed, vii) S270 of a PR exfoliation in which the remaining PR is removed using a striper, and viii) S280 of a check in which a defect of a product is checked.

S260 may include a wet etching and a dry etching. The wet etching is a method in which diluted hydro fluoric (HF) is mixed with deionized (DI) water in an appropriate ratio and an oxide layer deposited on the upper surface of the wafer is removed with the mixture in general. The dry etching is a method in which the deposited thin film is selectively removed by using plasma and a desirable material film is patterned on the wafer.

An electrostatic chuck (ESC) is generally used for a structural element for supporting the substrate subject to the etching process in a dry etching device. The ESC, which is used in a device for manufacturing a semiconductor device or an LCD substrate, is a component for fixing a wafer or a substrate with an electrostatic force. Such an ESC is widely used in various processes, such as a chemical vapor deposition, an etching, a sputtering, and an ion injection.

Generally, the mechanical clamp and the vacuum chuck, etc., was used for simply fixing the substrate. However, the ESC, which is capable of processing the uniform heat treatment and minimizing the generation of impure particles in a tight contact state of the substrate, has been widely used in a recent time.

The ESC has a structure in which an insulating layer, a conductive layer, and a dielectric layer are sequentially formed on a base substrate constituting a body and the conductive layer is connected with an external power by means of a power line. The substrate is disposed on an upper part of the dielectric layer. When a voltage is applied to the conductive layer via the power line, a negative charge is generated at one side and a positive charge is generated at the other side of the dielectric layer positioned between the substrate and the conductive layer by a dielectric polarization phenomenon. Further, the negative charge is generated in a surface that is in contact with the dielectric layer on the substrate and thus the substrate is attached to the ESC by the electric force between the substrate and the dielectric layer.

In the dry etching using the plasma discharge, the temperature of the substrate increases highly during the process, so that a burning of the PR functioning as a pattern mask is caused. The burned PR is not removed well in S270 of the PR exfoliation or cannot be removed if it is severe. In order to prevent such a problem, a cooling gas is circulated between the dielectric layer and the substrate, in which the cooling gas functions to absorb and discharge heat of the substrate. In order to prevent the cooling gas from leaking, the substrate is fixed with a clamp, etc.

The electrode is classified into a trench-type electrode and an emboss-type electrode according to a scheme of forming a path of the cooling gas within the dielectric layer. The trench-type electrode is a type for forming the cooling gas path in a channel type, and most regions of the electrode are in close contact with the substrate. The emboss-type electrode has an electrode surface shaped like protrusions, and the substrate is in contact with convex parts of the electrode surface.

Figure 5A:
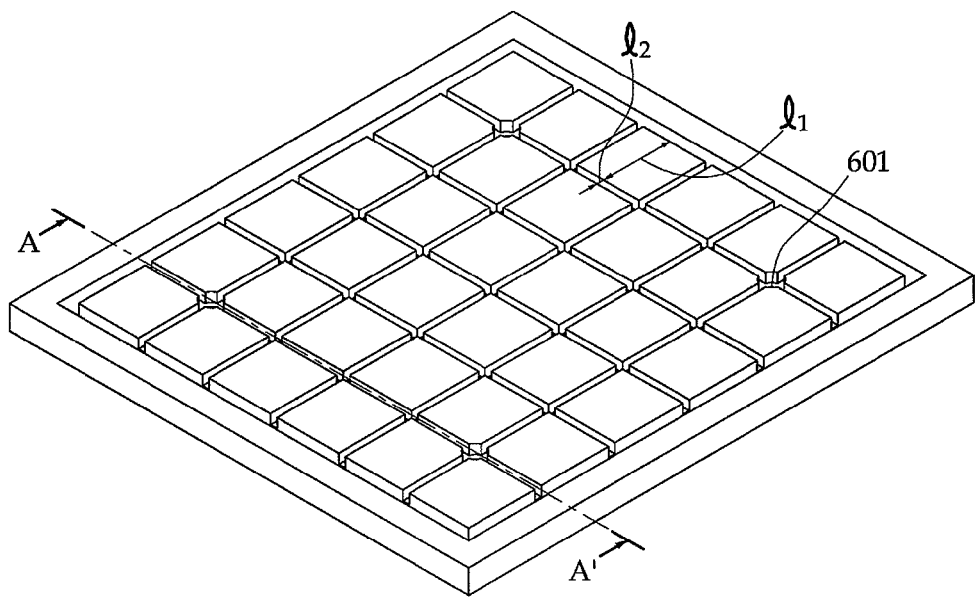
FIG. 5A is a perspective view illustrating an example of a structure of a trench-type electrode.
Figure 5B:
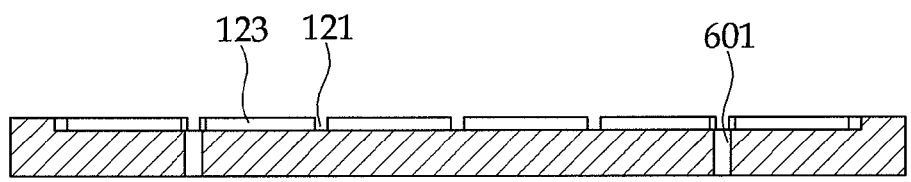
FIG. 5B is a cross-sectional view illustrating an example of a structure of a trench-type electrode.

FIG. 5A is a perspective view illustrating a trench-type electrode and FIG. 5B is a cross-sectional view illustrating the trench-type electrode of FIG. 5A taken along line A-A'. The trench-type electrode has channels 121 and contact parts 123. The contact part 123 is a part being in contact with the substrate, and the channel 121 is a movement path of the cooling gas. In the trench-type electrode, since the contact part 123 in close contact with the substrate has a wide area, and due to the temperature difference between the channel 121 and the contact part 123 and the etching rate difference by the temperature difference, the shape of the channel 121 is transferred to the substrate such that it can be seen by the naked eye. Such a transferred shape of the channel 121 is generally referred to "electrode spot" or "lattice spot".

Figure 6A:
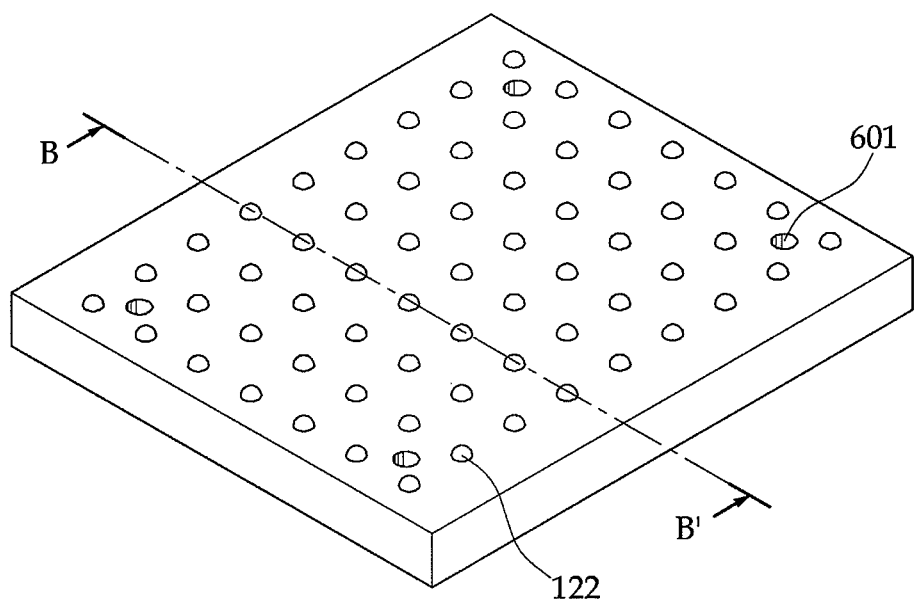
FIG. 6A is a perspective view illustrating an example of a structure of an emboss-type electrode.
Figure 6B:
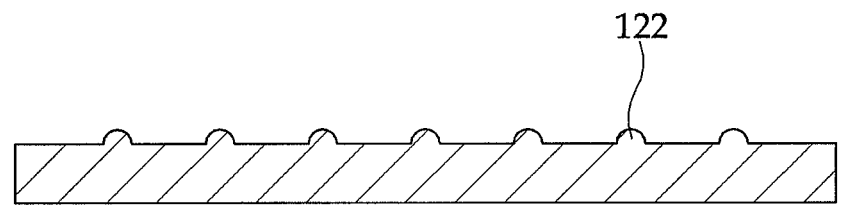
FIG. 6B is a cross-sectional view illustrating an example of a structure of an emboss-type electrode.

FIG. 6A is a perspective view illustrating an emboss-type electrode and FIG. 6B is a cross-sectional view illustrating the emboss-type electrode of FIG. 6A taken along line B-B'. The emboss-type electrode has protrusions 122 which are in contact with the substrate. Therefore, the contact area between the substrate and the electrode is extremely small, so that the shape of the electrode cannot be seen with the naked eye. However, as the contact area is small, the contact force between the substrate and the electrode is also small, so that the cooling gas is leaked to the outside of the substrate. The leakage of the cooling gas deteriorates the substrate cooling capability of the cooling gas and causes the temperature increase of the substrate and the burning of the PR of the mask. As a result, in the PR exfoliation process, the burned PR is not well removed or cannot be removed if it is severe.

That is, the spot generated in the dry etching in the event of the use of the trench-type electrode corresponds to a fatal defect in a display product, and the emboss-type electrode for the prevention of the fatal defect creates a process defect, such as the PR burning, according to the decrease of the contact force between the electrode and the substrate.

Hereinafter, embodiments will be described with reference to the accompanying drawings.

In order to clearly describe the disclosed embodiments, any part that is not related to the description is omitted and the same reference numerals are used to designate the same or similar components in the entire description.

The terms used in the present disclosure are used for simply describing a specific embodiment and is not considered limiting. The expression of the singular form includes the plural form except as otherwise clearly provided in contexts.

Figure 3:
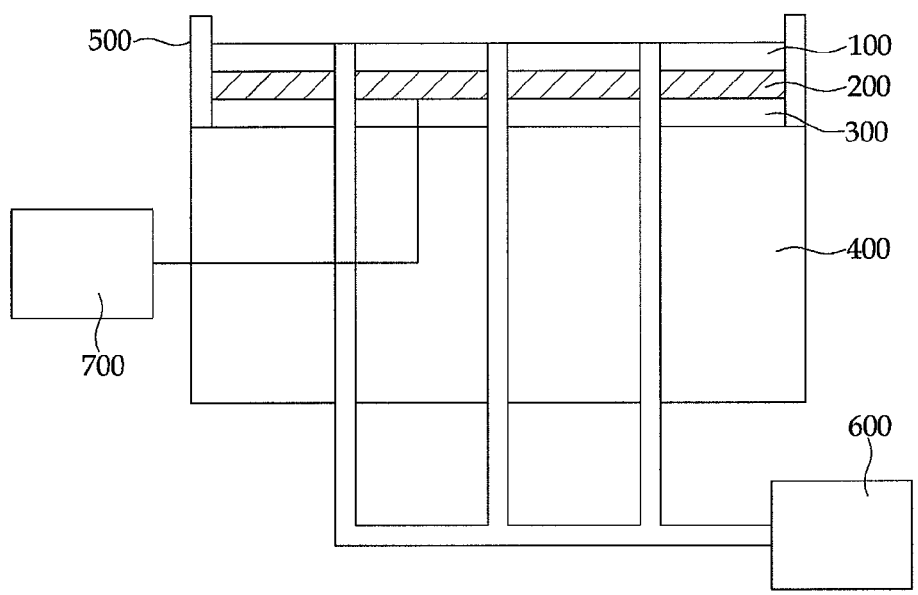
FIG. 3 is a cross-sectional view illustrating an electrostatic chuck according to an embodiment.

FIG. 3 is a cross-sectional view schematically illustrating an electrostatic chuck according to an embodiment.

Referring to FIG. 3, the electrostatic chuck includes a base substrate 400, an insulating layer 300, a conductive layer 200, a dielectric layer 100, a cooling gas supply device 600, and a power device 700.

In one embodiment, the base substrate 400 is shaped like a flat plate or a cylinder. The base substrate 400 generally has a size corresponding to that of a to-be-sucked object (e.g. a substrate). That is, the base substrate 400 may have a size substantially equal to that of a substrate for manufacturing a semiconductor device or a flat panel display device or a size larger than that of the substrate. The base substrate 400 may be made of a metal material or may include a metal coated layer on a surface thereof. The metal material may be aluminum (Al).

The insulating layer 300 is formed on the base substrate 400. The insulating layer 300 may be formed on a partial region of the upper surface of the base substrate 400. The insulating layer 300 may function to insulate the base substrate 400 and the conductive layer 200.

The conductive layer 200 is formed on the insulating layer 300. The conductive layer 200 may be formed on a partial region of the upper surface of the insulating layer 300. The conductive layer 200 is included for the generation of an electrostatic force. The conductive layer 200 generates the electrostatic force to the upper surface of the dielectric layer 100, and electro-statically sucks the substrate disposed on the dielectric layer 100 with the electrostatic force, to fix and support the substrate. In one embodiment, the conductive layer 200 is made at least partially of a conductive material. In one embodiment, the conductive layer 200 receives a high voltage from the power device 700 so as to generate the electrostatic force. The power device 700 may receive the high voltage from an external power source.

The conductive layer 200 and the dielectric layer 100 may be also separately referred to as an electrode. The 'electrode' in at least one of the disclosed embodiments means a layered structure of the conductive layer 200 and the dielectric layer 100.

The power device 700 is electrically connected with the conductive layer 200 extending through the base substrate 400 and the insulating layer 300. The power device 700 may supply a DC power.

In one embodiment, the cooling gas supply device 600 supplies cooling gas to a cooling gas line extending through the base substrate 400, the insulating layer 300, the conductive layer 200, and the dielectric layer 100. The cooling gas may be helium (He). In one embodiment, the cooling gas delivered via the cooling gas line functions to cool a to-be-sucked object (e.g. the substrate) that is to be disposed on the dielectric layer. The electrostatic chuck may further include a dam 500 that supports and is connected to the insulating layer 300, the conductive layer 200, and the dielectric layer 100 as shown in FIG. 4.

Figure 4:
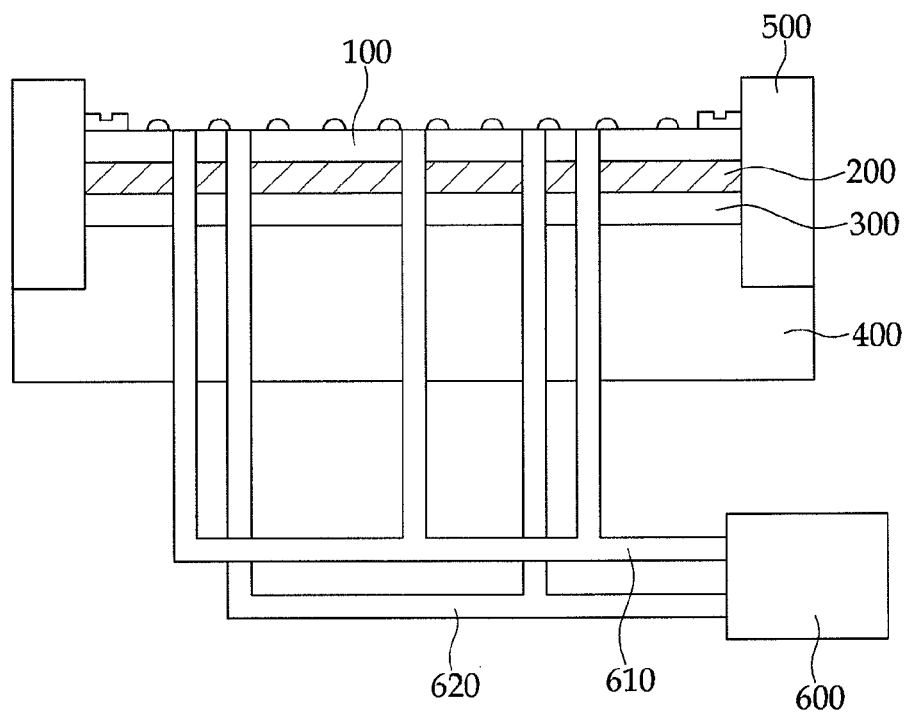
FIG. 4 is a cross-sectional view illustrating a structure of an electrostatic chuck according to an embodiment.

FIG. 4 illustrates a construction of the electrostatic chuck according to an embodiment.

Referring to FIG. 4, the electrostatic chuck includes the base substrate 400, the insulating layer 300, the conductive layer 200, the dielectric layer 100, the cooling gas supply device 600, a cooling gas introduction line 610, a cooling gas discharge line 620, and the power device 700. The dielectric layer 100 is formed on the conductive layer 200 (see FIG. 4). The dielectric layer 100 may be made of an insulating material, for example, a ceramic material.

In one embodiment, the cooling gas introduction line 610 and the cooling gas discharge line 620 extends through the base substrate 400, the insulating layer 300, the conductive layer 200, and the dielectric layer 100. The cooling gas generated in the cooling gas supply device 600 may be circulated in a scheme in which the cooling gas is introduced to the cooling gas introduction line 610 and is collected in the cooling gas discharge line 620, so that it functions to cool the to-be-sucked object (e.g. the substrate) that is to be disposed on the dielectric layer 100.

Here, the descriptions of the base substrate 400, the insulating layer 300, the conductive layer 200, the dielectric layer 100, the dam 500, the cooling gas supply device 600, and the power device 700 are same as those of FIG. 3.

Figure 7:
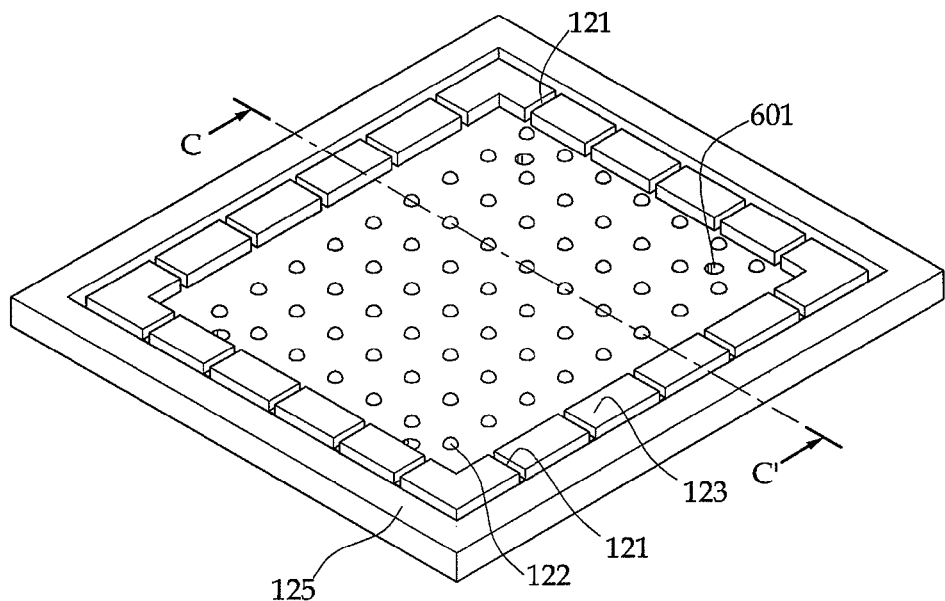
FIG. 7 is a perspective view illustrating a structure of a dielectric layer according to an embodiment
Figure 8:
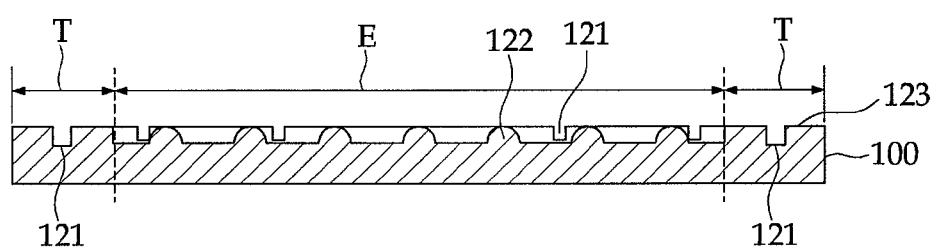
FIG. 8 is a cross-sectional view illustrating a structure of a dielectric layer according to an embodiment.
Figure 9:
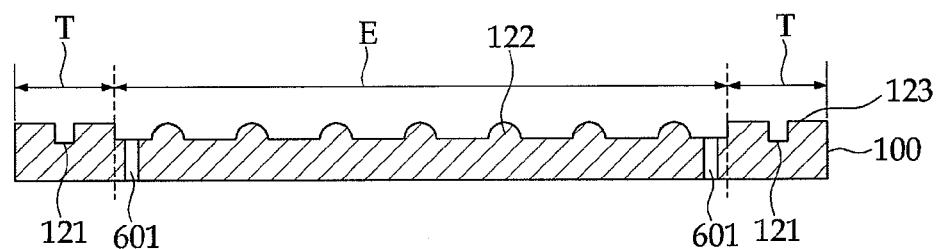
FIG. 9 is a cross-sectional view illustrating a trench part and an emboss part of a dielectric layer according to an embodiment.

FIGS. 7 to 9 illustrate the construction of the dielectric layer 100. Specifically, FIG. 7 is a perspective view illustrating of the dielectric layer 100 in which the trench part and the emboss part are combined and located, FIG. 8 is a cross-sectional view of the dielectric layer 100 taken along line C-C' of FIG. 7, and FIG. 9 is a cross-sectional view schematically illustrating only the trench part and the emboss part.

In one embodiment, as shown in FIG. 8, the dielectric layer 100 includes the emboss part and the trench part. The trench part may be located at the outside area of the dielectric layer and includes one or more channels. The emboss part may be located at an inside area of the dielectric layer and includes plural protrusions.

In one embodiment, the trench part includes channels 121, contact parts 123, and a closed circuit 125. The channel 121 is a movement path of the cooling gas and the contact part 123 supports both ends of the substrate. In one embodiment, the closed circuit 125 is formed at the outermost part of the dielectric layer as shown in FIG. 7, to prevent the cooling gas from leaking.

In one embodiment, the emboss part includes protrusions 122 and cooling gas inlets 601 (refer to FIG. 7). The protrusions 122 support the substrate while minimizing the contact area between the substrate and the dielectric layer 100. Since the protrusions 122 are distributed at the inside part of the dielectric layer 100, they can sufficiently support the substrate. In one embodiment, the cooling gas is circulated in a part other than the protrusions. By preventing the temperature increase of the substrate through smoothly supplying the cooling gas, the PR burning is prevented.

In one embodiment, as shown in FIGS. 7 to 9, the dielectric layer 100 includes the trench part (I), the emboss part (E), the channels 121, the protrusions 122, and the contact parts 123, the closed circuit 125, and the cooling gas inlets 601.

The trench part (T) may be located at the outside part of the dielectric layer 100 and include one or more channels 121. The emboss part (E) may be located at the inside part of the dielectric layer 100 and has plural protrusions.

In one embodiment, trench part (T) occupies about 2% to about 30% of the entire area of the dielectric layer and has the closed circuit shaped like a rim at the outside part of the dielectric layer 100. The trench part (I) occupies about 1% to about 10% of the entire width of the dielectric layer 100. The channel has the width $l_2$ of about 0.1 mm to about 50 mm, the depth of about 0.01 mm to about 1 mm, and the space $l_1$ with another channel of about 10 mm to about 1000 mm. The trench part (I), which has a narrow width in comparison with the entire width of the dielectric layer 100, functions to suck and support the substrate from both ends of the substrate.

In one embodiment, the emboss part (E) occupies about 70% to about 98% of the entire area of the dielectric layer 100, that is, the emboss part (E) corresponds to the remaining area other than the trench part (I) in the entire area of the dielectric layer. The protrusion has the height of about 0.01 mm to about 1 mm, a diameter of about 0.1 mm to about 10 mm, and the space (or distance) of about 1 mm to about 50 mm with a neighboring protrusion. The emboss part (T) functions to minimize the contract area between the substrate and the dielectric layer 100 in the most regions of the dielectric layer 100 except for the width of the trench part (T).

In one embodiment, the dielectric layer 100 includes i) the emboss part (E) which is the most regions of the dielectric layer 100 and has the minimal contact area, and the trench part (T) which is the outmost part of the dielectric layer 100, has the excellent substrate contact force, and includes the closed circuit 125, so that the dielectric layer 100 reduces the leaking of the cooling gas, smoothly supplies the cooling gas to the substrate, and stably sucks and supports the substrate. In one embodiment, the dielectric layer 100 improves the substrate suction and support capability, to decrease the leaking of the cooling gas, and smoothly supplies the cooling gas to the substrate, to solve the PR burning defect that is the disadvantage of the emboss-type electrode, while preventing the electrode spot or the lattice spot.

One embodiment includes an electrode for the electrostatic chuck which includes the conductive layer 200 and the dielectric layer 100. The conductive layer 200 is connected with the power device 700, and the dielectric layer 100 includes the emboss part and the trench part. The trench part may be located at the outside part of the dielectric layer and includes one or more channels, and the emboss part may be located at the inside part of the dielectric layer and includes plural protrusions.

According to at least one of the disclosed embodiments, the dielectric layer includes the trench part and the emboss part, so that it is possible to simultaneously solve the electrode spot or lattice spot and the defect caused by the PR burning which are the stubborn problems of the dry etching while having the stable suction and supporting capability. Further, it is possible to stably suck and support the large substrate by the electrostatic chuck without the drooping of the substrate.

Although the disclosed embodiments have been described with reference to the accompanying drawings, they are not considered limiting but to cover various modifications, additions and substitutions, without departing from the scope and spirit of the accompanying claims.

What is claimed is:

1. An electrostatic chuck for manufacturing a flat panel display, comprising:
   a base substrate;
   an insulating layer formed on the base substrate;
   a conductive layer formed on the insulating layer and electrically connected to a power device;
   a dielectric layer formed on the conductive layer and comprising an emboss part and a trench part surrounding the emboss part, wherein the emboss part comprises at least one protrusion, wherein the trench part comprises a plurality of contact parts and at least one channel between the contact parts, and wherein each of the contact parts has a width larger than that of the channel; and
   a cooling gas line extending through the base substrate, the insulating layer, the conductive layer, and the dielectric layer.

2. The electrostatic chuck as claimed in claim 1, wherein the emboss part occupies about 70% to about 98% of the entire area of the dielectric layer.

3. The electrostatic chuck as claimed in claim 1, wherein the at least one protrusion comprises a plurality of protrusions, and wherein each of the protrusions has a height of about 0.01 mm to about 1 mm, a diameter of about 0.1 mm to about 10 mm, and a distance of about 1 mm to about 50 mm with a neighboring protrusion.

4. The electrostatic chuck as claimed in claim 1, wherein the trench part occupies about 2% to about 30% of the entire area of the dielectric layer.

5. The electrostatic chuck as claimed in claim 1, wherein the trench part comprises a closed circuit which has a rim shape and surrounds the emboss part.

6. The electrostatic chuck as claimed in claim 1, wherein the trench part occupies about 1% to about 10% of the entire width of the dielectric layer.

7. The electrostatic chuck as claimed in claim 1, wherein the at least one channel comprises a plurality of channels, and wherein each of the channels has a width of about 0.1 mm to about 50 mm, a depth of about 0.01 mm to about 1 mm, and a distance of about 10 mm to about 1000 mm with a neighboring channel.

8. The electrostatic chuck as claimed in claim 1, wherein the cooling gas is helium (He).

9. The electrostatic chuck as claimed in claim 1, wherein the dielectric layer is formed of a ceramic material.

10. The electrostatic chuck as claimed in claim 1, wherein the power device is configured to supply a DC power.

11. The electrostatic chuck as claimed in claim 1, further comprising a dam supporting and connected to the insulating layer, the conductive layer and the dielectric layer.

12. The electrostatic chuck as claimed in claim 1, wherein each of the contact parts has a width of about 10 mm to about 1000 mm.

13. The electrostatic chuck as claimed in claim 1, wherein each of the contact parts is greater in area than the protrusion.

14. An electrode for an electrostatic chuck for manufacturing a flat panel display, comprising:
    a conductive layer formed on an insulating layer and electrically connected to a power device; and
    a dielectric layer formed on the conductive layer and comprising an emboss part and a trench part surrounding the emboss part, wherein the emboss part comprises at least one protrusion, wherein the trench part comprises a plurality of contact parts and at least one channel between the contact parts, and wherein each of the contact parts has a width larger than that of the channel.

15. The electrode as claimed in claim 14, wherein the emboss part occupies about 70% to about 98% of the entire area of the dielectric layer.

16. The electrode as claimed in claim 14, wherein the at least one protrusion comprises a plurality of protrusions, and wherein each of the protrusions has a height of about 0.01 mm to about 1 mm, a diameter of about 0.1 mm to about 10 mm, and a distance of about 1 mm to about 50 mm with a neighboring protrusion.

17. The electrode as claimed in claim 14, wherein the trench part occupies about 2% to about 30% of the entire area of the dielectric layer.

18. The electrode as claimed in claim 14, wherein the trench part comprises a closed circuit which has a rim shape and surrounds the emboss part.

19. The electrode as claimed in claim 14, wherein the trench part occupies about 1% to about 10% of the entire width of the dielectric layer.

20. The electrode as claimed in claim 14, wherein the at least one channel comprises a plurality of channels, and wherein at least one of the channels has a width of about 0.1 mm to about 50 mm, a depth of about 0.01 mm to about 1 mm, and a distance of about 10 mm to about 1000 mm with a neighboring channel.

21. The electrode as claimed in claim 14, wherein the cooling gas is helium (He).

22. The electrode as claimed in claim 14, wherein the dielectric layer is formed of a ceramic material.

23. The electrode as claimed in claim 14, wherein the power device is configured to supply a DC power.

24. The electrode as claimed in claim 14, wherein each of the contact parts has a width of about 10 mm to about 1000 mm.

25. The electrode as claimed in claim 14, wherein each of the contact parts is greater in area than the protrusion.

* * * * *